(12) United States Patent
Nasu

(10) Patent No.: US 6,215,328 B1
(45) Date of Patent: Apr. 10, 2001

(54) BUFFER CIRCUIT WITH SMALL DELAY

(75) Inventor: Koji Nasu, Tokyo (JP)

(73) Assignees: Mitsubishi Electric System LSI Design Corporation, Itami (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/266,591

(22) Filed: Mar. 11, 1999

(30) Foreign Application Priority Data

Oct. 16, 1998 (JP) .................................................. 10-295687

(51) Int. Cl.$^7$ .................... H03K 19/0185; H03K 19/017
(52) U.S. Cl. ................................ 326/83; 326/17; 326/58; 326/86
(58) Field of Search ................................. 326/83, 86–87, 326/121, 17, 56–58; 327/170

(56) References Cited

U.S. PATENT DOCUMENTS

| | | | |
|---|---|---|---|
| 5,319,252 | * | 6/1994 | Pierce et al. .......................... 327/170 |
| 5,389,834 | * | 2/1995 | Kinugasa et al. ...................... 326/58 |
| 5,391,939 | * | 2/1995 | Nonaka .................................. 326/83 |
| 5,760,620 | * | 6/1998 | Doluca ................................... 326/83 |
| 5,973,512 | * | 10/1999 | Baker ..................................... 326/87 |

FOREIGN PATENT DOCUMENTS 5-122049    5/1993   (JP) .

* cited by examiner

*Primary Examiner*—Jon Santamauro
(74) *Attorney, Agent, or Firm*—Burns, Doane, Swecker & Mathis, LLP

(57) ABSTRACT

A buffer circuit including a pair of complementary P-channel transistor and N-channel transistor connected in series, the connecting point of which is connected to an output terminal. The gate terminal of the P-channel transistor is connected to a power supply when the input signal is a low level, and to the output terminal when the input signal is a high level. The gate terminal of the N-channel transistor is connected to the output terminal when the input signal is the low level, and to a ground when the input signal is the high level. This makes it possible to solve a problem of a conventional buffer circuit in that an increasing capacity of a load connected to an output terminal increases a delay time between a time the input signal changes to the high level and a time the output signal changes to the high level.

14 Claims, 12 Drawing Sheets

A : GATE POTENTIAL OF P-CHANNEL TRANSISTOR 36
    WHEN LOAD CAPACITANCE IS SMALL
B : POTENTIAL OF OUTPUT TERMINAL 38
    WHEN LOAD CAPACITANCE IS SMALL
C : GATE POTENTIAL OF P-CHANNEL TRANSISTOR 36
    WHEN LOAD CAPACITANCE IS LARGE
D : POTENTIAL OF OUTPUT TERMINAL 38
    WHEN LOAD CAPACITANCE IS LARGE

BUFFER CIRCUIT WITH SMALL DELAY

BACKGROUND OF THE INVENTION

1. Field of the Invention

The present invention relates to a buffer circuit for temporarily storing information transferred between computers, for example.

2. Description of Related Art

FIG. 12 is a circuit diagram showing a conventional buffer circuit. In FIG. 12, the reference numeral 1 designates an input terminal for inputting an input signal; 2 designates an input terminal for inputting EL disable signal (low (L) active signal) when halting the output of an output signal from an output terminal 11; reference numerals 3 and 4 each designate an inverter for inverting a signal level; 5 designates a NAND circuit to which the input signal and the inverted signal from the inverter 4 are supplied; 6 designates a NOR circuit to which the input signal and the inverted signal from the inverter 3 are supplied; 7 designates a power supply; 8 designates a ground; 9 designates a P-channel transistor that is brought out of conduction when its gate potential is at a high (H) level, and into conduction when its gate potential is at a low (L) level; 10 designates an N-channel transistor that is brought into conduction when its gate potential is at a high (H) level, and out of conduction when its gate potential is at a low (L) level; and 11 designates the output terminal for outputting an output signal.

Next, the operation of the conventional buffer circuit will be described.

The buffer circuit of FIG. 12 outputs from the output terminal 11 an L level signal when an L level input signal is supplied to the input terminal 1, and an H level signal when an H level input signal is supplied to the input terminal 1. Let us assume here that the disable signal to the input terminal 2 is always placed at the H level so as to enable the output signal to be output from the output terminal 11, because only the operation of this case will be described here.

First, when the L level input signal is supplied to the input terminal 1, the NAND circuit 5 is supplied with the L level input signal and the H level inverted signal as shown in FIG. 13, placing the gate potential of the P-channel transistor 9 at the H level. Accordingly, the P-channel transistor 9 is brought out of conduction, and the output terminal 11 is disconnected from the power supply 7.

At the same time, when the L level input signal is supplied to the input terminal 1, the NOR circuit 6 is supplied with the L level input signal and the L level inverted signal as shown in FIG. 13, placing the gate potential of the N-channel transistor 10 at the H level. Accordingly, the N-channel transistor 10 is brought into conduction, and the output terminal 11 is connected to the ground 8.

Thus, when the L level signal is input to the input terminal 1, the output terminal 11 is connected to the ground 8, which will place the potential of the output terminal 11 at zero, thereby producing the L level output signal from the output terminal 11.

Second, when the H level input signal is supplied to the input terminal 1, the NAND circuit 5 is supplied with the H level input signal and the H level inverted signal as shown in FIG. 14, placing the gate potential of the P-channel transistor 9 at the L level. Accordingly, the P-channel transistor 9 is brought into conduction, and the output terminal 11 is connected to the power supply 7.

At the same time, when the H level input signal is supplied to the input terminal 1, the NOR circuit 6 is supplied with the H level input signal and the L level inverted signal as shown in FIG. 14, placing the gate potential of the N-channel transistor 10 at the L level. Accordingly, the N-channel transistor 10 is brought out of conduction, and the output terminal 11 is disconnected from the ground 8.

Thus, when the H level signal is input to the input terminal 1, the output terminal 11 is connected to the power supply 7. This will place the potential of the output terminal 11 at the power supply level, thereby producing the H level output signal from the output terminal 11.

Therefore, when the input signal rises from the L level to H level, the output signal also changes from the L level to H level. In this case, the voltage rising rate of the output signal is determined by the capacity of a load connected to the output terminal 11 and the on-resistance of the P-channel transistor 9. An increase of the capacity of the load connected to the output terminal 11 will reduce the voltage rising rate, thereby increasing a delay time between the rise of the input signal to the H level and that of the output signal to the H level.

With the foregoing arrangement, the conventional buffer circuit can produce the output signal of the same level as the input signal. The buffer circuit, however, has a problem of an increasing delay time between the rise of the input signal and that of the output signal due to an increase of the capacity of the load connected to the output terminal 11.

SUMMARY OF THE INVENTION

The present invention is implemented to solve the foregoing problem. It is therefore an object of the present invention to provide a buffer circuit capable of reducing the increase in the delay time due to the increase in the capacity of the load connected to the output terminal.

According to a first aspect of the present invention, there is provided a buffer circuit comprising: a first transistor that has its first terminal connected to a power supply, and its second terminal connected to an output terminal, and that is brought out of conduction when its gate potential is at a high level, and is brought into conduction when its gate potential is at a low level, a second transistor that has its first terminal connected to a ground, and its second terminal connected to the output terminal, and that is brought into conduction when its gate potential is at the high level, and is brought out of conduction when its gate potential is at a low level; a first gate potential control means for connecting a gate terminal of the first transistor to the power supply when the input signal is at the low level, and for connecting the gate terminal of the first transistor to the output terminal when the input signal is at the high level; and a second gate potential control means for connecting a gate terminal of the second transistor to the output terminal when the input signal is at the low level, and for connecting the gate terminal of the second transistor to the ground when the input signal is at the high level.

Here, the first gate potential control means may connect, when the input signal changes from the low level to the high level, the gate terminal of the first transistor to the ground after a feedback period has elapsed.

The second gate potential control means may connect, when the input signal changes from the high level to the low level, the gate terminal of the second transistor to the power supply after a feedback period has elapsed.

The first gate potential control means may comprise selecting means for selecting the feedback period.

The second gate potential control means may comprise selecting means for selecting the feedback period.

The first gate potential control means may comprise selecting means for selecting a feedback amount of the output signal to the gate terminal of the first transistor.

The second gate potential control means may comprise selecting means for selecting a feedback amount of the output signal to the gate terminal of the second transistor.

The first gate potential control means may connect, when a disable signal is input, the gate terminal of the first transistor to the power supply, and the second gate potential control means may connect, when the disable signal is input, the gate terminal of the second transistor to the ground.

DETAILED DESCRIPTION OF THE PREFERRED EMBODIMENTS

The invention will now be described with reference to the accompanying drawings.

Embodiment 1

Figure 1:
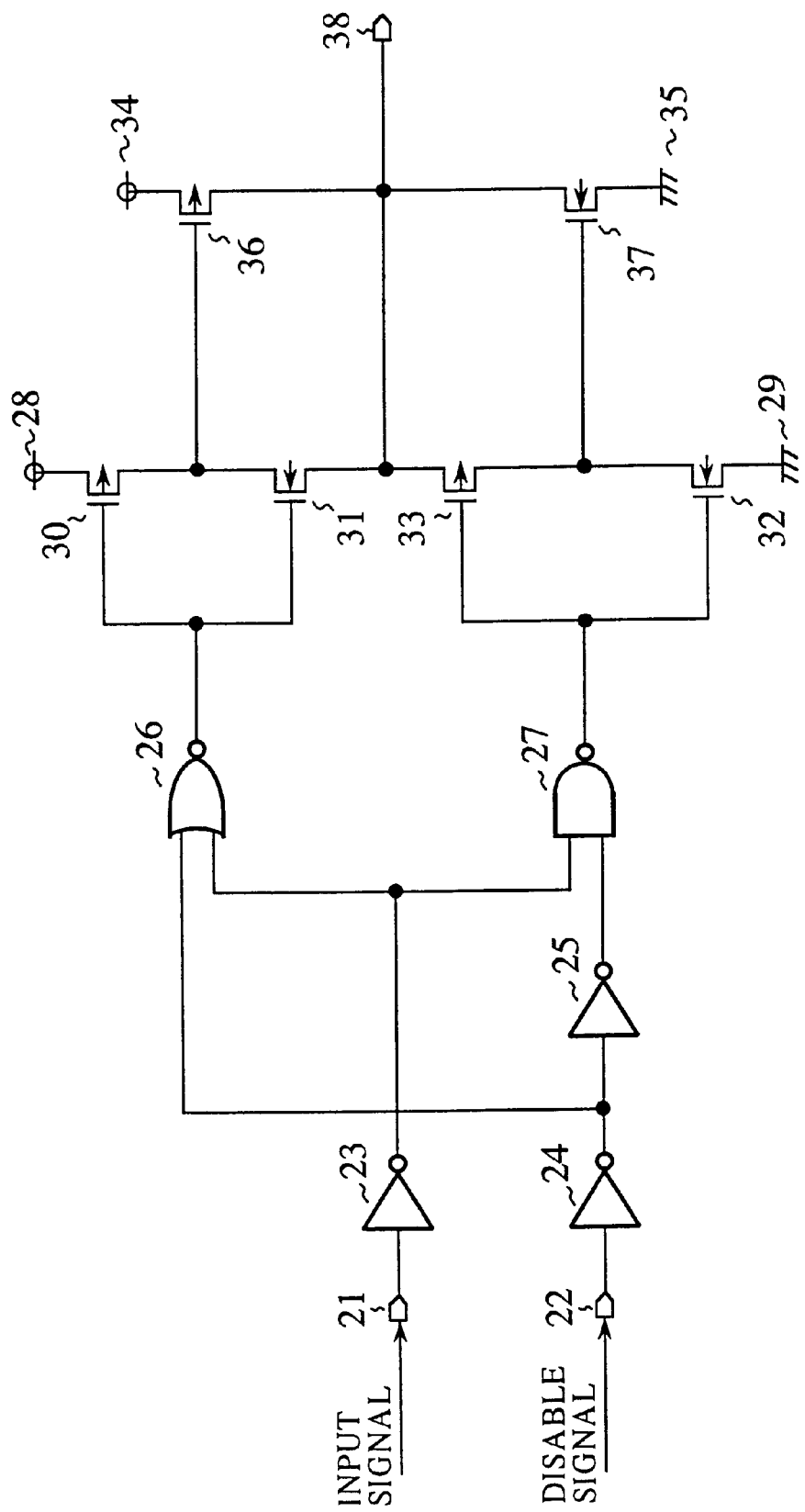
FIG. 1 is a circuit diagram showing an embodiment 1 of a buffer circuit in accordance with the present invention.

FIG. 1 is a circuit diagram showing an embodiment 1 of a buffer circuit in accordance with the present invention. In this figure, the reference numeral 21 designates an input terminal for inputting an input signal; 22 designates an input terminal for inputting a disable signal (low (L) active signal) when halting the output of an output signal from an output terminal 38; reference numerals 23, 24 and 25 each designate an inverter for inverting a signal level (first gate potential control means and second gate potential control means); 26 designates a NOR circuit (first gate potential control means) to which the inverted signal from the inverter 23 and the inverted signal from the inverter 24 are supplied; and 27 designates a NAND circuit (second gate potential control means) to which the inverted signal from the inverter 23 and the inverted signal from the inverter 25 are supplied.

The reference numeral 28 designates a power supply; 29 designates a ground; 30 designates a P-channel transistor that is brought into conduction when the output signal of the NOR circuit 26 is at the L level, and is brought out of conduction when it is at the H level; 31 designates an N-channel transistor that is brought out of conduction when the output signal of the NOR circuit 26 is at the L level, and is brought into conduction when it is at the H level; 32 designates an N-channel transistor that is brought out of conduction when the output signal of the NAND circuit 27 is at the L level, and is brought into conduction when it is at the H level; and 33 designates a P-channel transistor that is brought into conduction when the output signal of the NAND circuit 27 is at the L level, and out of conduction when it is at the H level.

Here, the power supply 28, P-channel transistor 30 and N-channel transistor 31 constitute the first gate potential control means, and the ground 29, N-channel transistor 32 and P-channel transistor 33 constitute the second gate control means.

The reference numeral 34 designates a power supply; 35 designates a ground; 36 designates a P-channel transistor (first transistor) that is brought out of conduction when its gate potential is at the H level, and into conduction when its gate potential is at the L level; 37 designates an N-channel transistor (second transistor) that is brought into conduction when its gate potential is at the H level, and out of conduction when its gate potential is at the L level; and 38 designates the output terminal for outputting an output signal.

Next, the operation of the of the present embodiment 1 of the buffer circuit will be described.

The buffer circuit of FIG. 1 outputs from the output terminal 38 the L level signal when the L level input signal is supplied to the input terminal 21, and outputs the H level signal when the H level input signal is supplied to the input terminal 21. Let us assume that the disable signal to the input terminal 22 is always placed at the H level to enable the output signal to be produced from the output terminal 38 because only the operation of this case will be described here.

Figure 2:
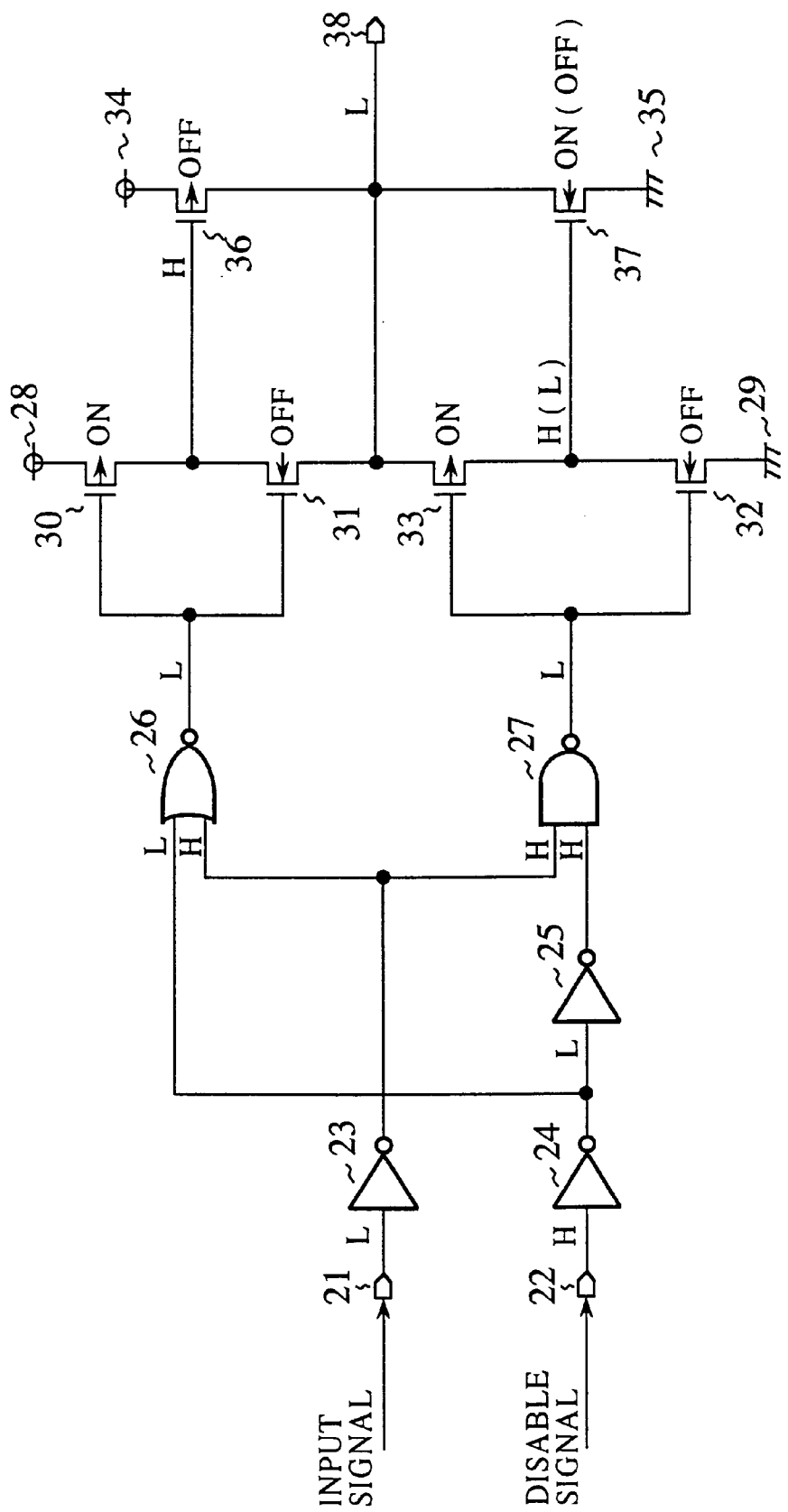
FIG. 2 is a diagram illustrating the state of various portions when an L level input signal is applied to an input terminal 21.

First, when the L level input signal is supplied to the input terminal 21, the NOR circuit 26 is supplied with an L level inverted signal and an H level inverted signal as shown in FIG. 2, placing the gate potential of the P-channel transistor 30 and that of the N-channel transistor 31 at the L level. Accordingly, the P-channel transistor 30 is brought into conduction, and the N-channel transistor 31 is brought out of conduction, connecting the gate terminal of the P-channel transistor 36 to the power supply 28. Thus, the P-channel transistor 36 is brought out of conduction because its gate potential is placed at the H level, and hence the output terminal 38 is disconnected from the power supply 34.

At the same time, when the L level input signal is supplied to the input terminal 21, the NAND circuit 27 is supplied with the H level inverted signal and the H level inverted signal as shown in FIG. 2, placing the gate potential of the N-channel transistor 32 and P-channel transistor 33 at the L level. Accordingly, the N-channel transistor 32 is brought out of conduction, and the P-channel transistor 33 is brought into conduction, connecting the gate terminal of the N-channel transistor 37 to the output terminal 38. Thus, the gate terminal of the N-channel transistor 37 is connected to the output terminal 38 because the N-channel transistor 32 is brought out of conduction and the P-channel transistor 33 is brought into conduction.

As a result, the gate potential of the N-channel transistor 37 agrees with the signal level of the output terminal 38, which means that immediately before the fall of the output signal from the H level to L level due to the fall of the input signal from the H level to L level, the gate potential of the N-channel transistor 37 is placed at the H level, thereby maintaining the N-channel transistor 37 at the conduction state, and keeping the connected state of the output terminal 38 to the ground 35.

Thus, when the L level signal is input to the input terminal 21, the output terminal 38 is connected to the ground 35, which will place the potential of the output terminal 38 at zero, thereby producing the L level output signal from the output terminal 38.

When the signal level of the output terminal 38 changes from the H level to L level, the N-channel transistor 37 is brought out of conduction because its gate potential changes from the H level to L level, in which case although the output terminal 38 is disconnected from the ground 35, its signal level is maintained at the L level because the output terminal 38 keeps the disconnected state from the power supply 34.

Figure 3:
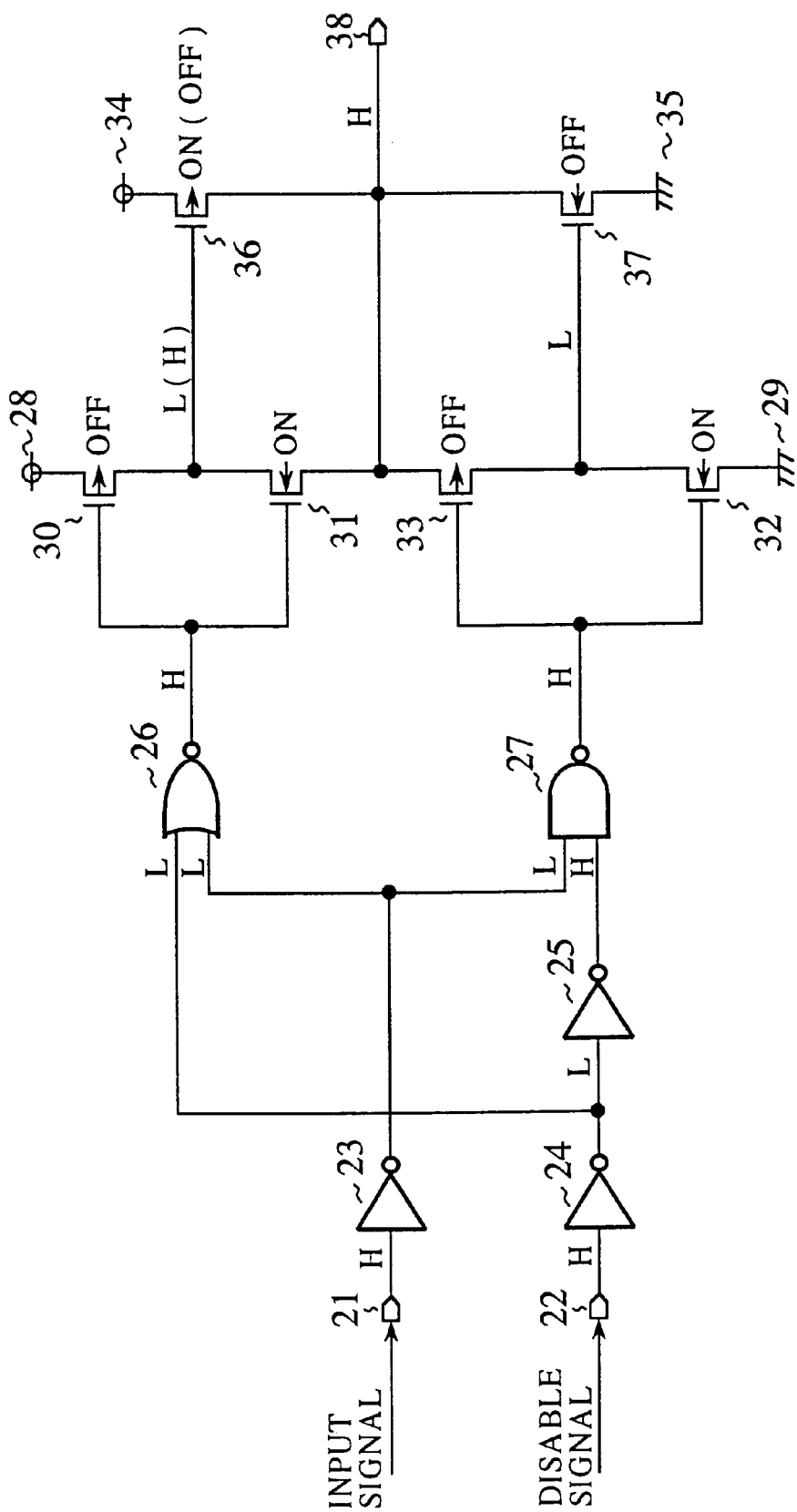
FIG. 3 is a diagram illustrating the state of the various portions when an H level input signal is applied to the input terminal 21.

Second, when the H level input signal is supplied to the input terminal 21, the NAND circuit 27 is supplied with the L level inverted signal and the H level inverted signal as shown in FIG. 3, placing the gate potential of the N-channel transistor 32 and that of the P-channel transistor 33 at the H level. Accordingly, the N-channel transistor 32 is brought into conduction, and the P-channel transistor 33 is brought out of conduction, connecting the gate terminal of the N-channel transistor 37 to the ground 29.

As a result, the N-channel transistor 37 is brought out of conduction because its gate potential is placed at the L level, disconnecting the output terminal 38 from the ground 35.

At the same time, when the H level input signal is supplied to the input terminal 21, the NOR circuit 26 is supplied with the L level inverted signal and the L level inverted signal as shown in FIG. 3, placing the gate potential of the P-channel transistor 30 and that of the N-channel transistor 31 at the H level. Accordingly, the P-channel transistor 30 is brought out of conduction, and the N-channel transistor 31 is brought into conduction. Therefore, the gate terminal of the P-channel transistor 36 is connected to the output terminal 38.

Thus, the gate potential of the P-channel transistor 36 agrees with the signal level of the output terminal 38, which means that immediately before the rise of the output signal from the L level to H level due to the rise of the input signal from the L level to H level, the gate potential of the P-channel transistor 36 is placed at the L level, thereby maintaining the P-channel transistor 36 at the conduction state, and keeping the connected state between the output terminal 38 and the power supply 34 for a while.

Thus, when the H level signal is input to the input terminal 21, the output terminal 38 is connected to the power supply 34. This will place the potential of the output terminal 38 at the power supply potential level, thereby producing the H level output signal from the output terminal 38.

When the signal level of the output terminal 38 changes from the L level to H level, the P-channel transistor 36 is brought out of conduction because its gate potential changes from the L level to H level, in which case although the output terminal 38 is disconnected from the power supply 34, its signal level is maintained at the H level because the output terminal 38 keeps the disconnected state from the ground 35.

As described before, when the input signal rises from the L level to H level, the output signal also changes from the L level to H level, in which case the voltage rising rate of the output signal is determined by the capacity of a load connected to the output terminal 38 and the on-resistance of the P-channel transistor 33. Thus, an increase of the capacity of the load connected to the output terminal 38 will reduce, in the conventional buffer circuit, the voltage rising rate, thereby increasing the delay time. The present embodiment 1, however, can reduce the delay time.

The reason for this is as follows:

When the input signal rises from the L level to H level, and the P-channel transistor 30 is brought out of conduction, the gate terminal of the P-channel transistor 36 is disconnected from the power supply 28, and is connected to the output terminal 38 through the N-channel transistor 31 which is brought into conduction. Thus, the gate potential of the P-channel transistor 36 gradually decreases as shown in FIG. 4, and then increases following the potential of the output terminal 38 when the gate potential falls below the potential of the output terminal 38.

Figure 4:
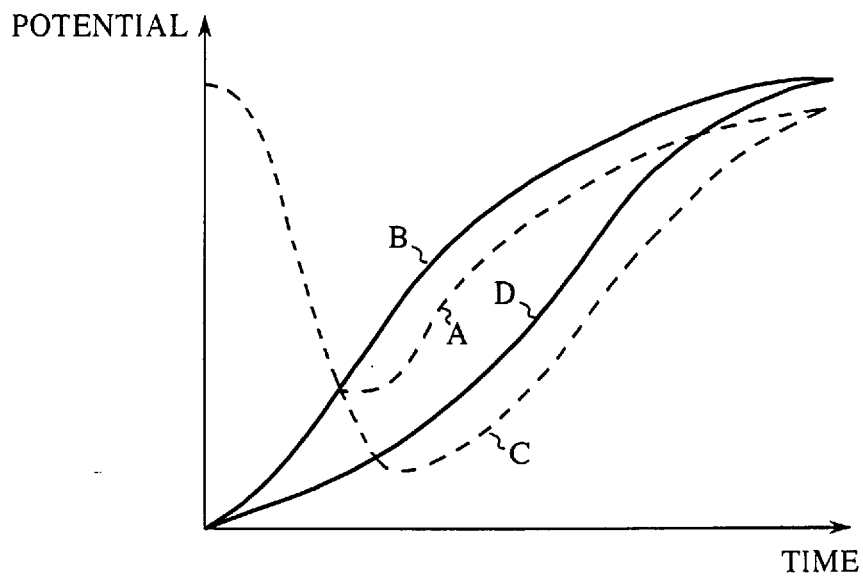
FIG. 4 is a graph illustrating potential variations of the gate potential of a P-channel transistor 36 and potential variations of an output terminal 38.

As a result, when the initial voltage rising rate of the output signal is small as denoted by the solid curve D in FIG. 4 owing to an increase of the capacity of the load connected to the output terminal 38, the gate potential of the P-channel transistor 36 becomes lower than that when the capacity of the load is smaller as indicated by the broken curve C, thereby reducing the on-resistance of the P-channel transistor 36

Because an increasing capacity of the load connected to the output terminal 38 will further reduce the on-resistance of the P-channel transistor 36, the voltage rising rate of the output signal is improved in proportion, thereby making it possible to prevent the delay time from being increased.

Here, although the reason is described why the present embodiment 1 can prevent the increase of the delay time by way of example in which the input signal changes from the L level to H level, the voltage falling rate of the output signal is also improved in sharpness on the same reason when the input signal changes from the H level to L level.

As described above, the present embodiment 1 is configured such that the gate terminal of the P-channel transistor 36 is connected to the power supply 28 when the input signal is at the L level, and to the output terminal 38 when the input signal is at the H level, and that the gate terminal of the N-channel transistor 37 is connected to the output terminal 38 when the input signal is at the L level, and to the ground 35 when the input signal is at the H level. This offers an advantage of being able to prevent the delay time from being increased even if a large capacity load is connected to the output terminal 38.

Embodiment 2

Figure 5:
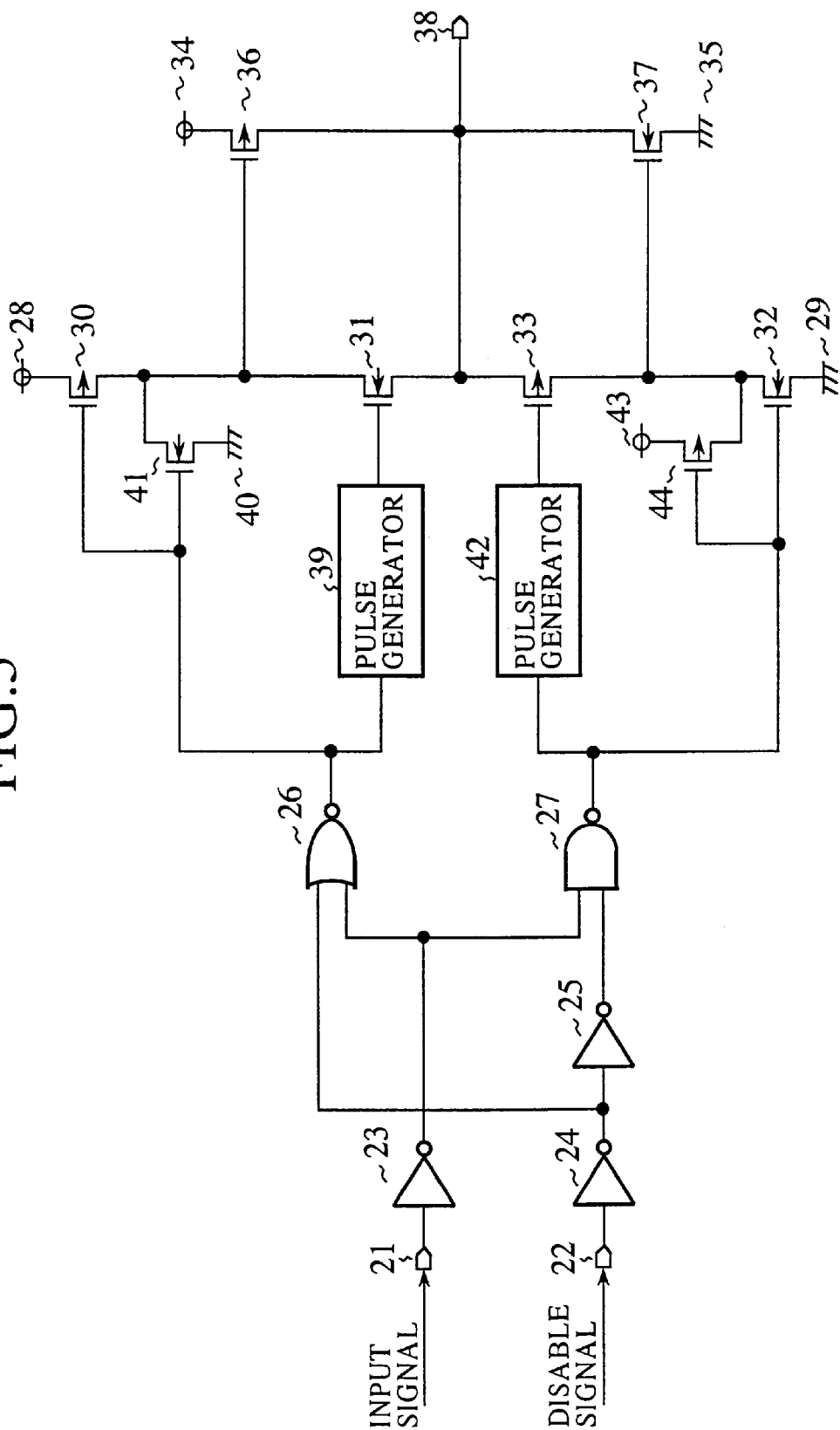
FIG. 5 is a circuit diagram showing an embodiment 2 of the buffer circuit in accordance with the present invention.

FIG. 5 is a circuit diagram showing an embodiment 2 of the buffer circuit in accordance with the present invention. In FIG. 2, the same reference numerals designate the same or like portions to those of FIG. 1, and the description thereof is omitted here.

The reference numeral 39 designates a pulse generator (first gate potential control means) that places the gate potential of the N-channel transistor 31 at the H level when the output signal of the NOR circuit 26 rises from the L to H level because the input signal rises from the L to H level, and that places the gate potential of the N-channel transistor 31 at the L level when a feedback period is over; 40 designates a ground (first gate potential control means); and 41 designates an N-channel transistor (first gate potential control means) that is brought out of conduction when the output signal of the NOR circuit 26 is at the L level and is brought into conduction when it is at the H level.

The reference numeral 42 designates a pulse generator (second gate potential control means) that places the gate potential of the P-channel transistor 33 at the L level when the output signal of the NAND circuit 27 falls from the H to L level because the input signal falls from the H to L level, and that places the gate potential of the P-channel transistor 33 at the H level when a feedback period is over; 43 designates a power supply (second gate potential control means); and 44 designates a P-channel transistor (second gate potential control means) that is brought cut of conduction when the output signal of the NAND circuit 27 is at the H level and is brought into conduction when it is at the L level.

Next, the operation of the present embodiment 2 will be described.

In the foregoing embodiment 1, when the input signal rises from the L to H level, and hence the output signal also rises to the H level, the P-channel transistor 36 is brought out of conduction, in which case superimposition of noise on the output signal is likely to occur because both the P-channel transistor 36 and N-channel transistor 37 are brought out of conduction at the same time.

Figure 6:
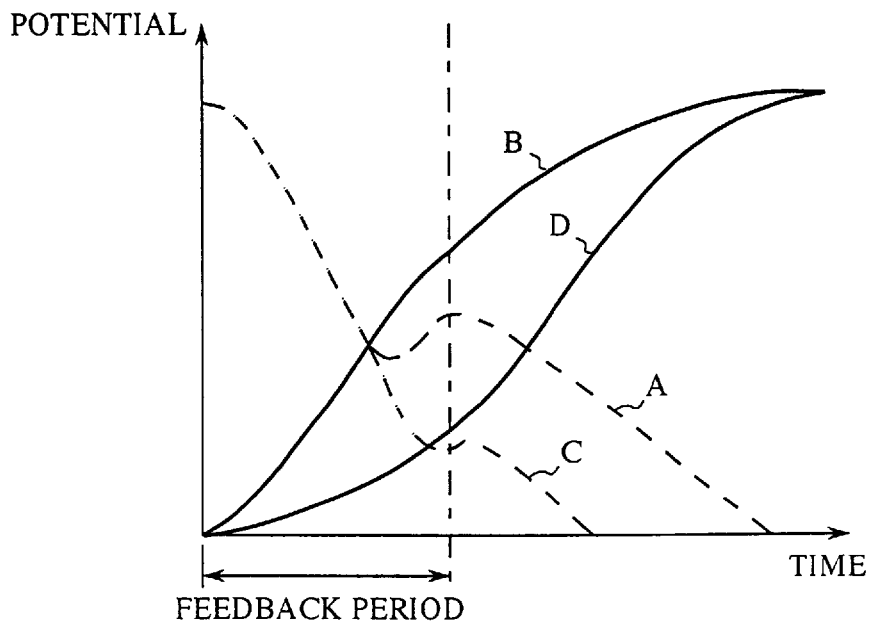
FIG. 6 is a graph illustrating potential variations of the gate potential of the P-channel transistor 36 and potential variations of the output terminal 38.

To prevent the noise from being superimposed on the output signal, the present embodiment 2 is equipped with the pulse generator 39 that outputs, when the input signal rises from the L to the H level, and hence the output signal of the NOR circuit 26 rises from the L to H level, a pulse to place the gate potential of the N-channel transistor 31 at the H level as in the embodiment 1, and that halts the output of the pulse when the feedback period is over to place the gate potential of the N-channel transistor 31 at the L level as illustrated in FIG. 6.

This will causes the gate potential of the P-channel transistor 36 to rise following the potential of the output terminal 38, and then to be fixed at the zero potential (because the gate terminal of the P-channel transistor 36 is connected to the ground 40 through the N-channel transistor 41), which maintains the conduction state of the P-channel transistor 36, thereby improving the noise resistance of the output signal.

On the other hand, in the foregoing embodiment 1, when the input signal falls from the H to L level, and hence the output signal also falls to the L level, the N-channel transistor 37 is brought out of conduction, in which case superimposition of noise on the output signal is likely to occur because both the P-channel transistor 36 and N-channel transistor 37 are brought out of conduction at the same time.

To prevent the noise from being superimposed on the output signal, the present embodiment 2 is equipped with the pulse generator 42 that outputs, when the input signal falls from the H to the L level, and hence the output signal of the NAND circuit 27 falls from the H to L level, a pulse to place the gate potential of the P-channel transistor 33 at the L level as in the embodiment 1, and that halts the output of the pulse when the feedback period is over to place the gate potential of the P-channel transistor 33 at the H level.

This will causes the gate potential of the N-channel transistor 37 to fall following the potential of the output terminal 38, and then to be fixed at the power supply potential (because the gate terminal of the N-channel transistor 37 is connected to the power supply 43 through the P-channel transistor 44), which maintains the conduction state of the N-channel transistor 37, thereby improving the noise resistance of the output signal.

Embodiment 3

Figure 7:
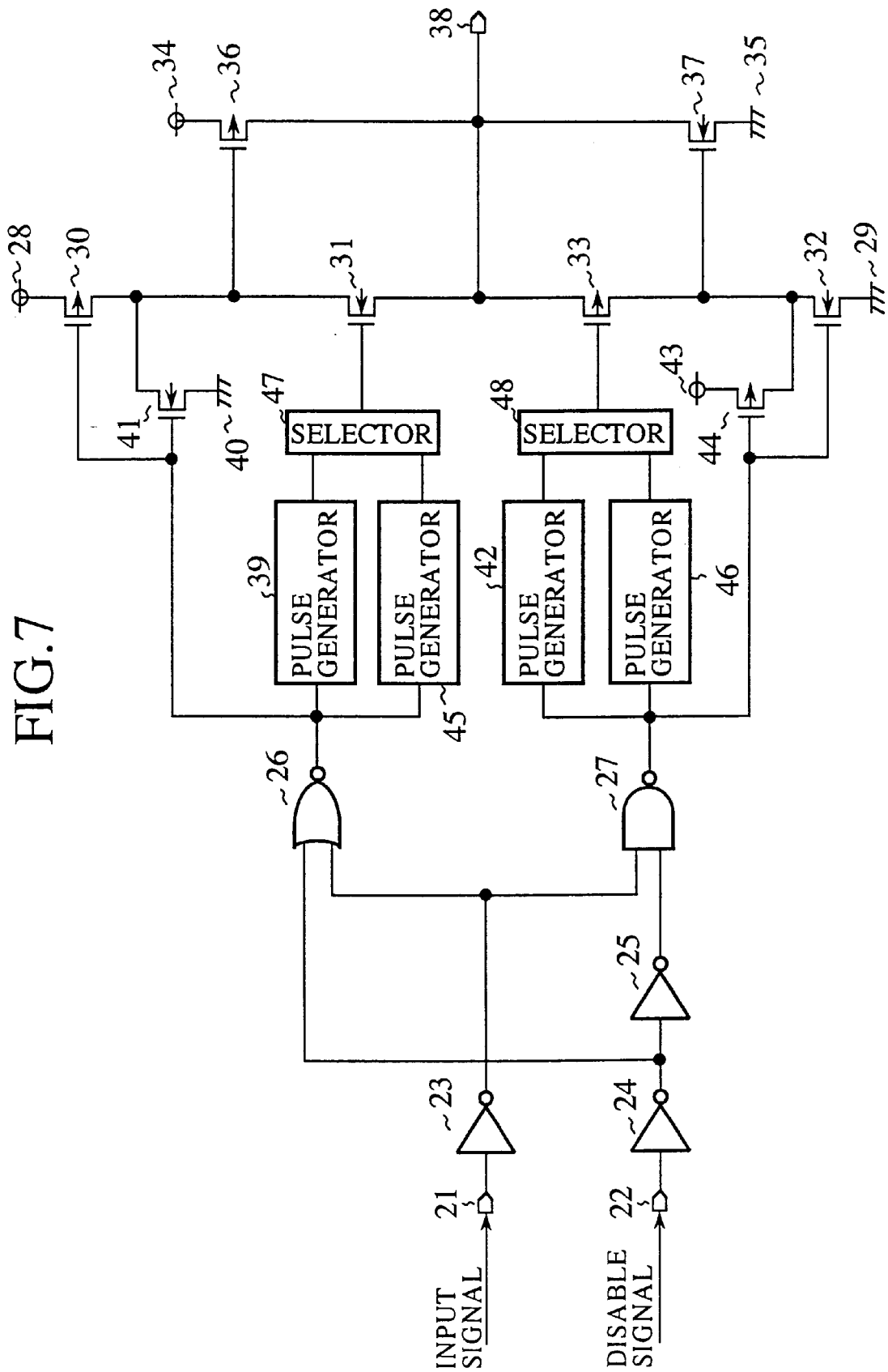
FIG. 7 is a circuit diagram showing an embodiment 3 of the buffer circuit in accordance with the present invention.

Although the feedback period is fixed in the foregoing embodiment 2, it can be varied by providing a plurality of pulse generators 39, 42, 45 and 46 and selectors (select means) 47 and 48 for selecting a pair of the outputs of pulse generators as shown in FIG. 7.

This makes it possible to select a desired feedback period, and hence offers an advantage of being able to vary waveform characteristics of the output signal as needed.

Embodiment 4

Figure 8:
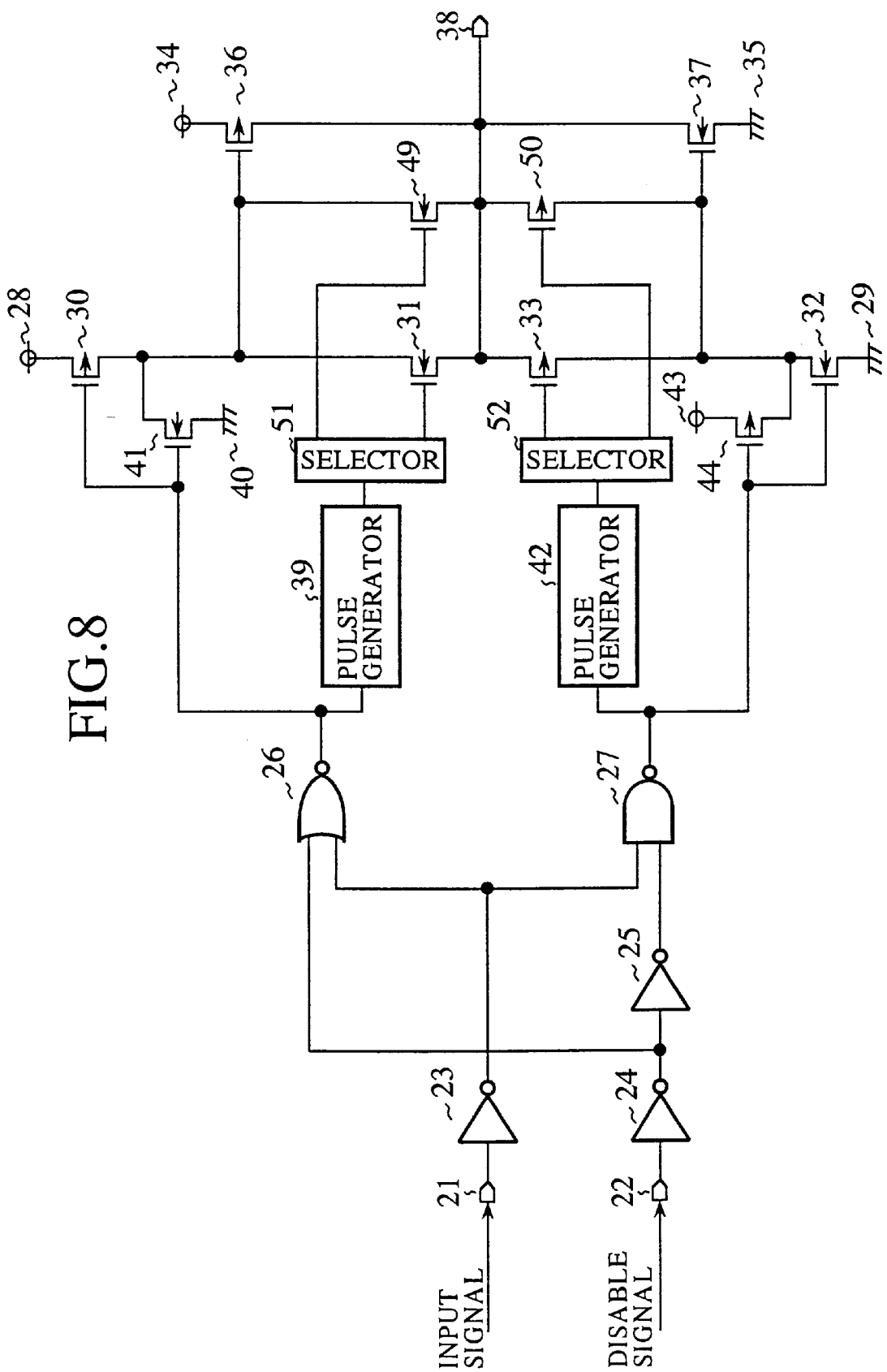
FIG. 8 is a circuit diagram showing an embodiment 4 of the buffer circuit in accordance with the present invention.

Although the feedback period is selected in the foregoing embodiment 3, it can be varied by providing, as shown in FIG. 8, a plurality of N-channel transistors 31 and 49 with different resistance characteristics, a plurality of P-channel transistors 33 and 50 with different resistance characteristics, and selectors (select means) 51 and 52 for selecting a pair of the N and P-channel transistors.

This makes it possible to select a desired feedback amount to the gate terminals of the P-channel transistor 36 and N-channel transistor 37, and hence offers an advantage of being able to vary waveform characteristics of the output signal as needed.

Embodiment 5

Figure 9:
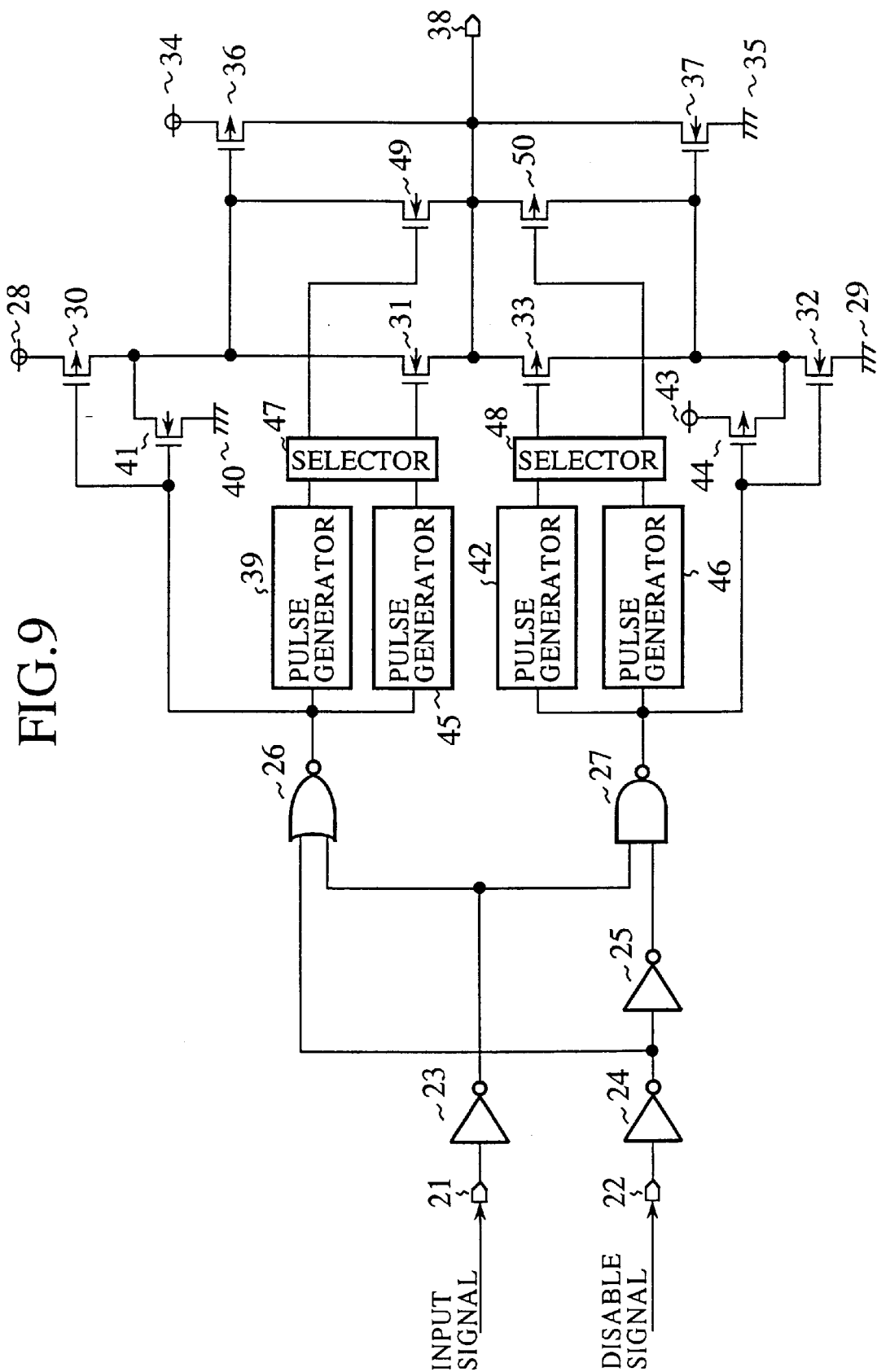
FIG. 9 is a circuit diagram showing an embodiment 5 of the buffer circuit in accordance with the present invention.

Although the foregoing embodiment 3 selects the feedback period, and the embodiment 4 selects the feedback amount of the output signal, both of them can be selected as shown in FIG. 9.

Embodiment 6

Although the foregoing embodiments 1–5 assume that the signal level at the input term 22 is always at the H level because the disable signal is not applied to the input terminal 22, the present embodiment 6 will handle a case in which the disable signal is applied to the input terminal 22.

Figure 10:
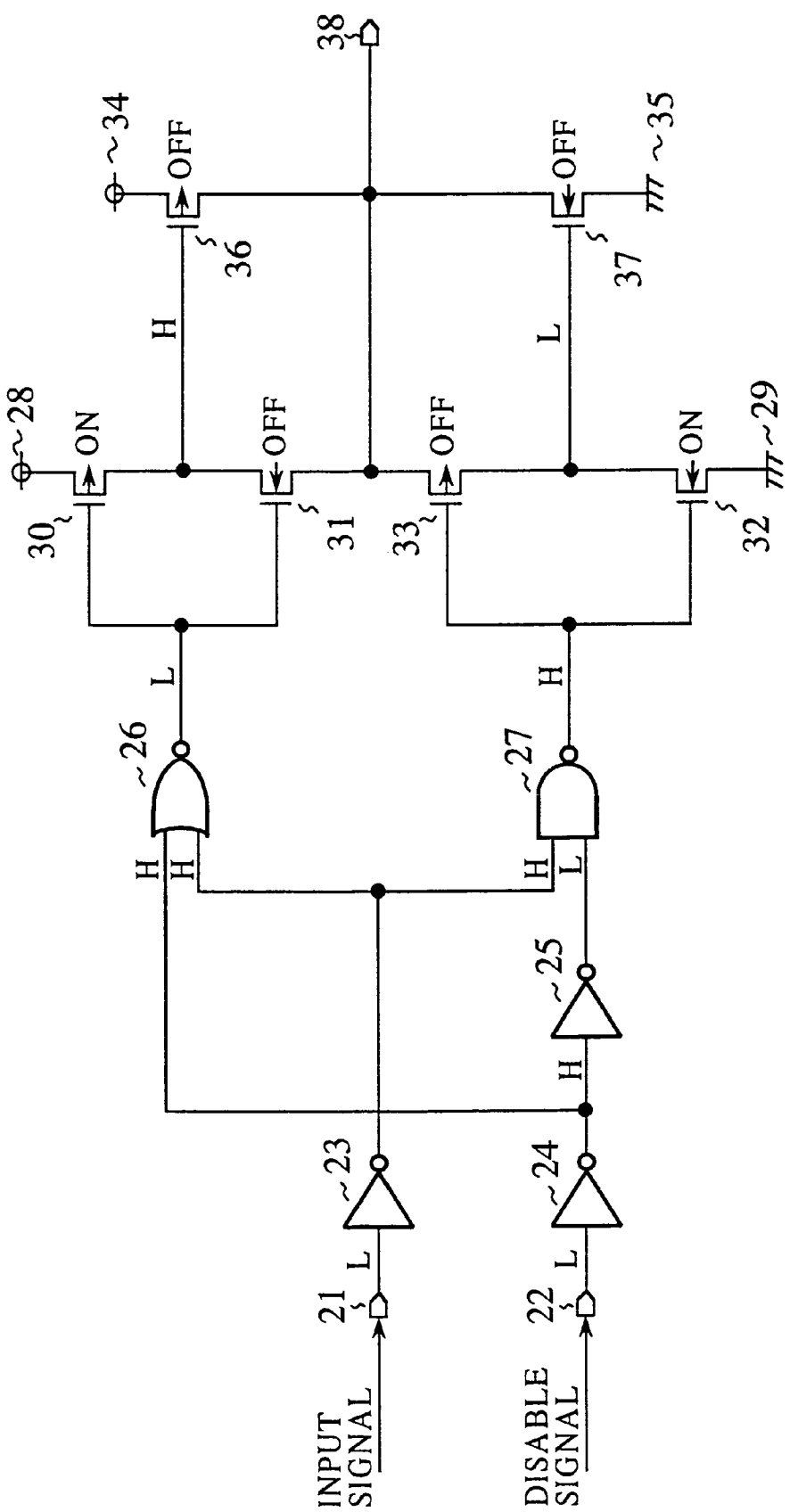
FIG. 10 is a diagram illustrating the state of various portions when a disable signal is applied to an input terminal 22.
Figure 11:
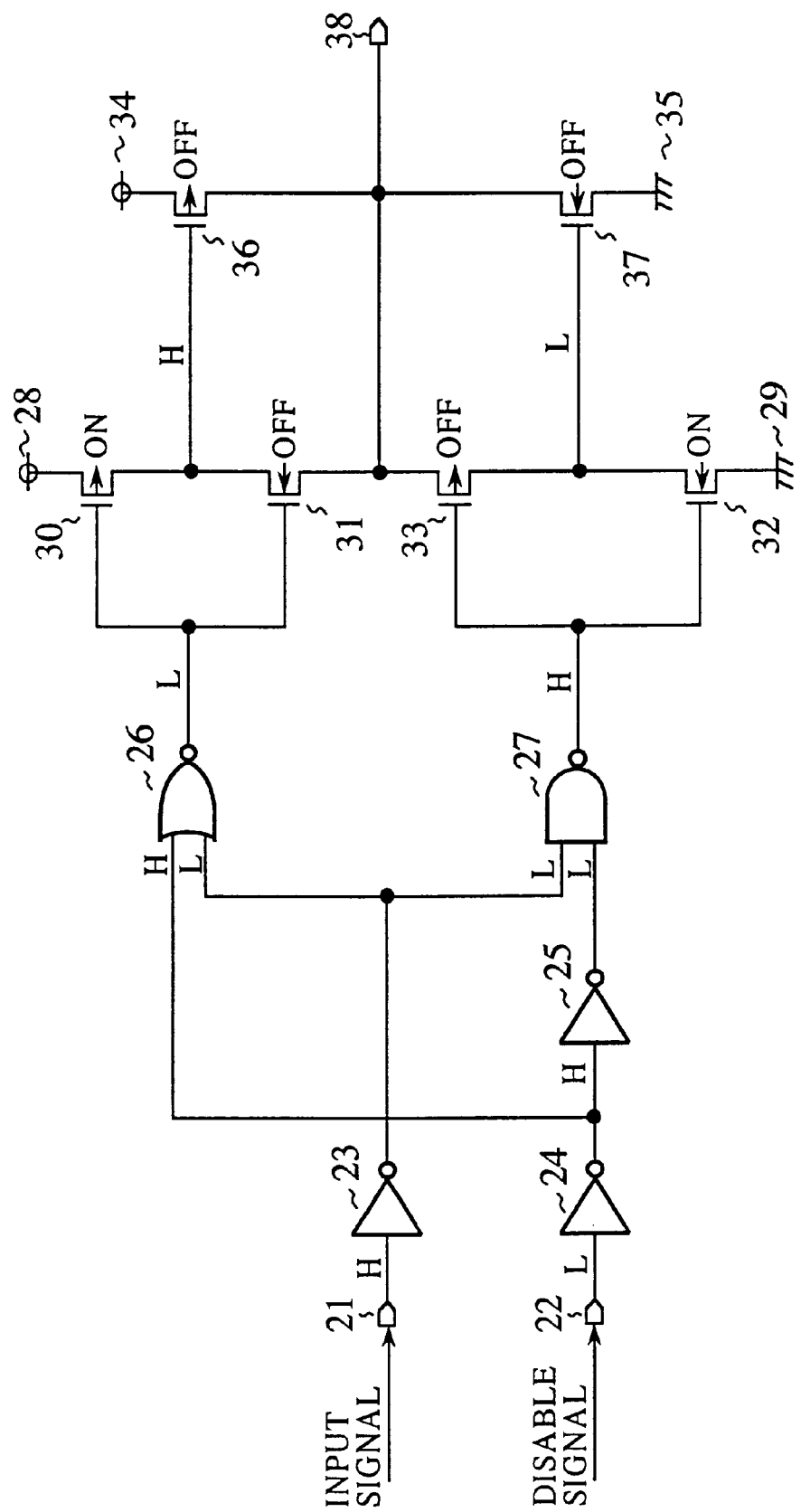
FIG. 11 a diagram illustrating the state of the various portions when the disable signal is applied to the input terminal 22.
Figure 12:
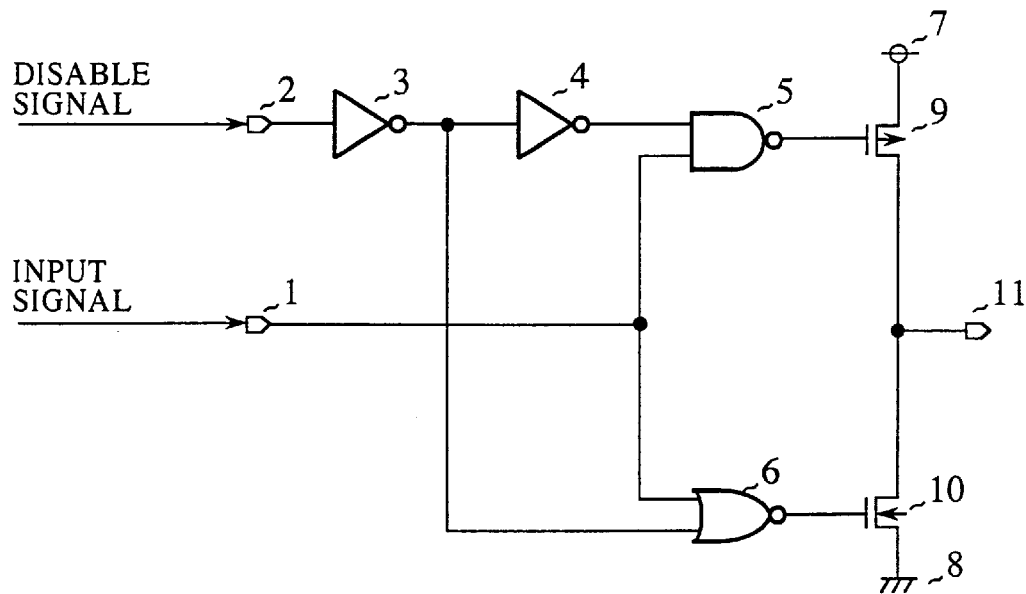
FIG. 12 is a circuit diagram showing a configuration of a conventional buffer circuit.
Figure 13:
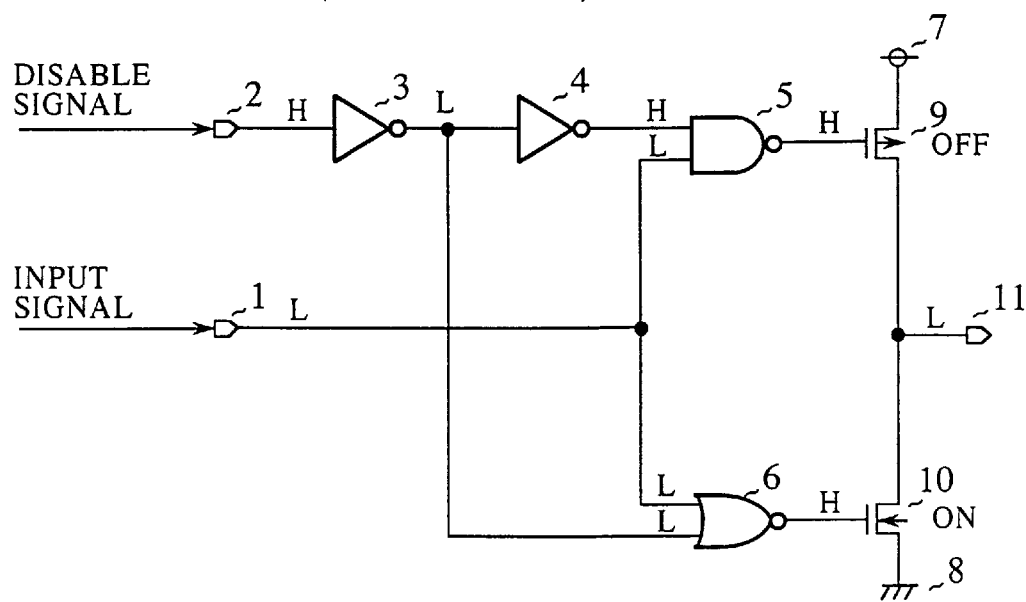
FIG. 13 is a diagram illustrating the state of various portions when an L level input signal is applied in the conventional buffer circuit.
Figure 14:
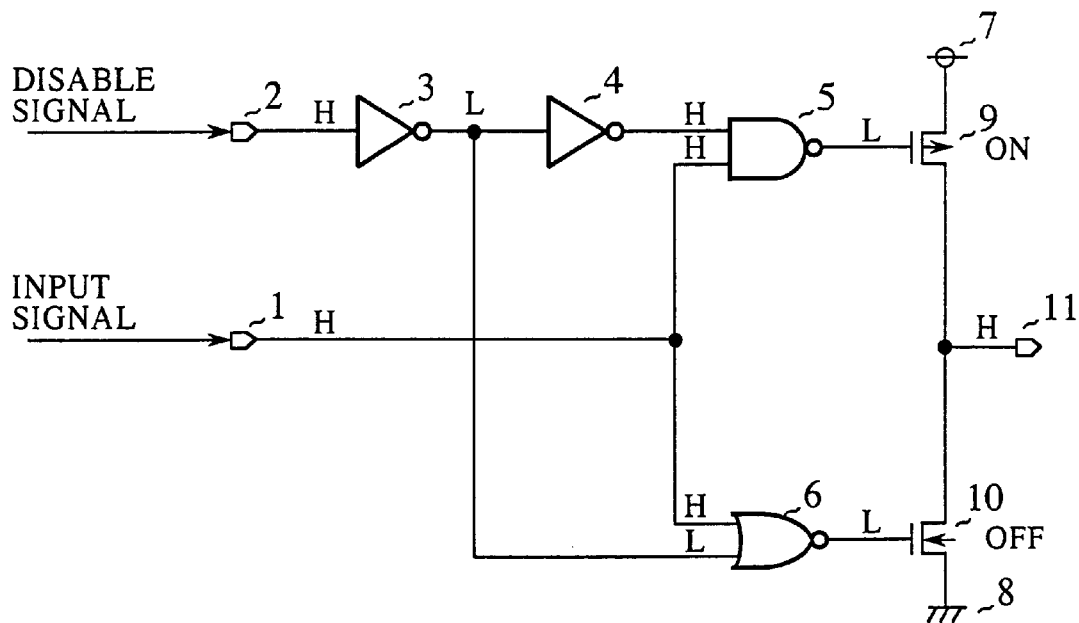
FIG. 14 is a diagram illustrating the state of the various portions when an H level input signal is applied in the conventional buffer circuit.
Figure 15:
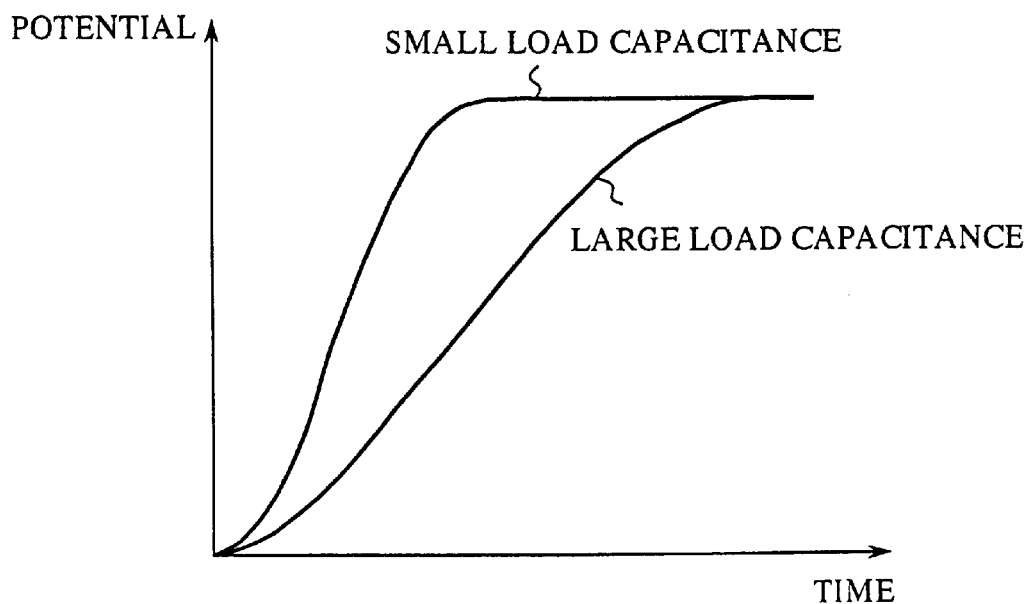
FIG. 15 is a graph illustrating potential variations of the output signal of the conventional buffer circuit.

When the disable signal is applied to the input terminal 22, the P-channel transistor 36 and N-channel transistor 37 are brought out of conduction as shown in FIGS. 10 and 11.

Thus, the signal level of the output signal is maintained at the level before the disable signal is applied, independently of the changes of the signal level of the input signal.

What is claimed is:

1. A buffer circuit comprising:
   a first transistor that has its first terminal connected to a power supply, and its second terminal connected to an output terminal, and that is brought out of conduction when its gate potential is at a high level, and is brought into conduction when its gate potential is at a low level;
   a second transistor that has its first terminal connected to a ground, and its second terminal connected to said output terminal, and that is brought into conduction when its gate potential is at the high level, and is brought out of conduction when its gate potential is at a low level;
   a first gate potential control means for connecting a gate terminal of said first transistor to the power supply when an input signal of said first gate potential control means is at the low level, and for connecting the gate terminal of said first transistor to said output terminal for a feedback period when the input signal is at the high level, the feedback period elapsing before the input signal changes a next time from a high level to a low level; and
   a second gate potential control means for correcting a gate terminal of said second transistor to said output terminal when the input signal is at the low level, and for connecting the gate terminal of said second transistor to the ground when the input signal is at the high level;

wherein said first gate potential control means disconnects the gate terminal of said first transistor from said output terminal at an end of said feedback period to said next timing.

2. The buffer circuit as claimed in claim 1, wherein said first gate potential control means connects, when the input signal changes from the low level to the high level, the gate terminal of said first transistor to the ground after said feedback period has elapsed.

3. The buffer circuit as claimed in claim 1, wherein said second gate potential control means connects, when the input signal changes from the high level to the low level, the gate terminal of said second transistor to the power supply after the feedback period has elapsed, the feedback period elapsing before a next time that the input signal changes from the low level to the high level.

4. The buffer circuit as claimed in claim 1, wherein said first gate potential control means connects, when a disable signal is input, the gate terminal of said first transistor to the power supply, and said second gate potential control means connects, when said disable signal is input, the gate terminal of said second transistor to the ground.

5. The buffer circuit as claimed in claim 2, wherein said first gate potential control means comprises:
   a third transistor selectively connecting the gate terminal of said first transistor to said output terminal;
   a first pulse generator outputting a pulse to a gate terminal of said third transistor to make said third transistor an ON state when the input signal changes from the low level to the high level, a pulse having a width which is shorter than a rising period of the output signal;
   wherein said third transistor becomes an OFF state between the period and said next timing based on said pulse.

6. The buffer circuit as claimed in claim 5, wherein said first gate potential control means comprises a fourth transistor selectively connecting the gate terminal of said first transistor to the ground when the input signal is the high level.

7. The buffer circuit as claimed in claim 6, wherein said first gate potential control means further comprises:
   a second pulse generator outputting a pulse to a gate terminal of said third transistor to make said third transistor an ON state when the input signal changes from the low level to the high level, a pulse having a width which is shorter than a rising period of the output signal and the width is different from said width of said first pulse generator; and
   a selector selectively connecting the gate of said third transistor to either of said first or second generator.

8. The buffer circuit as claimed in claim 6, wherein said first gate potential control means comprises:
   a fifth transistor selectively connecting the gate terminal of said first transistor to said output terminal, said fifth transistor having a different resistance characteristic; and
   a selector selectively connecting said pulse generator to either gate of said third or fifth transistor.

9. The buffer circuit as claimed in claim 3, wherein said second gate potential control means comprises:
   a sixth transistor selectively connecting the gate terminal of said second transistor to said output terminal;
   a pulse generator outputting a pulse to a gate terminal of said sixth transistor to make said sixth transistor an ON state when the input signal changes from the low level to the high level, a pulse having a width which is shorter than a dropping period of the output signal.

10. The buffer circuit as claimed in claim 9, wherein said first gate potential control means comprises a seventh transistor selectively connecting the gate terminal of said second transistor to the ground when the input signal is the low level.

11. The buffer circuit comprising:
   a first transistor that has its first terminal connected to a power supply, and its second terminal connected to an output terminal, and that is brought out of conduction when its gate potential is at a high level, and is brought into conduction when its gate potential is at a low level;
   a second transistor that has its first terminal connected to a ground, and its second terminal connected to said output terminal, and that is brought into conduction when its gate potential is at the high level, and is brought out of conduction when its gate potential is at a low level;
   a first gate potential control means for connecting a gate terminal of said first transistor to the power supply when the input signal is at the low level, and for connecting the gate terminal of said first transistor to said output terminal when the input signal is at the high level; and
   a second gate potential control means for connecting a gate terminal of said second transistor to said output terminal when the input signal is at the low level, and for connecting the gate terminal of said second transistor to the ground when the input signal is at the high level,
   wherein said first gate potential control means connects, when the input signal changes from the low level to the high level, the gate terminal of said first transistor to the ground after a feedback period has elapsed,
   wherein said first gate potential control means comprises selecting means for selecting the feedback period.

12. The buffer circuit comprising:
   a first transistor that has its first terminal connected to a power supply, and its second terminal connected to an output terminal, and that is brought out of conduction when its gate potential is at a high level, and is brought into conduction when its gate potential is at a low level;
   a second transistor that has its first terminal connected to a ground, and its second terminal connected to said output terminal, and that is brought into conduction when its gate potential is at the high level, and is brought out of conduction when its gate potential is at a low level;
   a first gate potential control means for connecting a gate terminal of said first transistor to the power supply when the input signal is at the low level, and for connecting the gate terminal of said first transistor to said output terminal when the input signal is at the high level; and
   a second gate potential control means for connecting a gate terminal of said second transistor to said output terminal when the input signal is at the low level, and for connecting the gate terminal of said second transistor to the ground when the input signal is at the high level,
   wherein said second gate potential control means connects, when the input signal changes from the high level to the low level, the gate terminal of said second transistor to the power supply after a feedback period has elapsed, wherein said second gate potential control means comprises selecting means for selecting the feedback period.

13. The buffer circuit comprising:

a first transistor that has its first terminal connected to a power supply, and its second terminal connected to an output terminal, and that is brought out of conduction when its gate potential is at a high level, and is brought into conduction when its gate potential is at a low level;

a second transistor that has its first terminal connected to a ground, and its second terminal connected to said output terminal, and that is brought into conduction when its gate potential is at the high level, and is brought out of conduction when its gate potential is at a low level;

a first gate potential control means for connecting a gate terminal of said first transistor to the power supply when the input signal is at the low level, and for connecting the gate terminal of said first transistor to said output terminal when the input signal is at the high level; and a second gate potential control means for connecting a gate terminal of said second transistor to said output terminal when the input signal is at the low level, and for connecting the gate terminal of said second transistor to the ground when the input signal is at the high level, wherein said first gate potential control means comprises selecting means for selecting a feedback amount of the output signal to the gate terminal of said first transistor.

14. The buffer circuit comprising:

a first transistor that has its first terminal connected to a power supply, and its second terminal connected to an output terminal, and that is brought out of conduction when its gate potential is at a high level, and is brought into conduction when its gate potential is at a low level;

a second transistor that has its first terminal connected to a ground, and its second terminal connected to said output terminal, and that is brought into conduction when its gate potential is at the high level, and is brought out of conduction when its gate potential is at a low level;

a first gate potential control means for connecting a gate terminal of said first transistor to the power supply when the input signal is at the low level, and for connecting the gate terminal of said first transistor to said output terminal when the input signal is at the high level; and a second gate potential control means for connecting a gate terminal of said second transistor to said output terminal when the input signal is at the low level, and for connecting the gate terminal of said second transistor to the ground when the input signal is at the high level, wherein said second gate potential control means comprises selecting means for selecting a feedback amount of the output signal to the gate terminal of said second transistor.

* * * * *